United States Patent [19]

Schultz

[11] 4,083,013

[45] Apr. 4, 1978

[54] MONOSTABLE MULTIVIBRATOR TIMER CIRCUITS WITH RESET

[75] Inventor: Frederick K. Schultz, Bringhurst, Ind.

[73] Assignee: General Motors Corporation, Detroit, Mich.

[21] Appl. No.: 760,565

[22] Filed: Jan. 19, 1977

[51] Int. Cl.² ............................................. H03K 3/10
[52] U.S. Cl. ................................... 328/207; 307/272; 307/293
[58] Field of Search .................. 307/293, 272, 273; 328/207, 72

[56] References Cited

U.S. PATENT DOCUMENTS

| | | | |
|---|---|---|---|
| 3,676,699 | 7/1972 | Warren | 307/273 |
| 3,725,680 | 4/1973 | Silva | 328/207 |
| 3,904,894 | 9/1975 | Ciolli | 307/273 |

Primary Examiner—Stanley D. Miller, Jr.
Assistant Examiner—B. P. Davis
Attorney, Agent, or Firm—C. R. Meland

[57] ABSTRACT

A pair of monostable multivibrator timers is described having a noninverted output terminal, an inverting output terminal, a timing capacitor coupled between the input and the noninverting output terminal and a timing resistor coupled between the high voltage side of a voltage source and the input terminal. The inputs of each of the monostable multivibrators are selectively grounded to provide a timed output signal upon termination of the input ground. The inverting output of each of the monostable multivibrators is coupled to the input of the other multivibrator so as to terminate an existing timed output signal provided by one multivibrator upon the initiation of a timed output from the other multivibrator.

2 Claims, 1 Drawing Figure

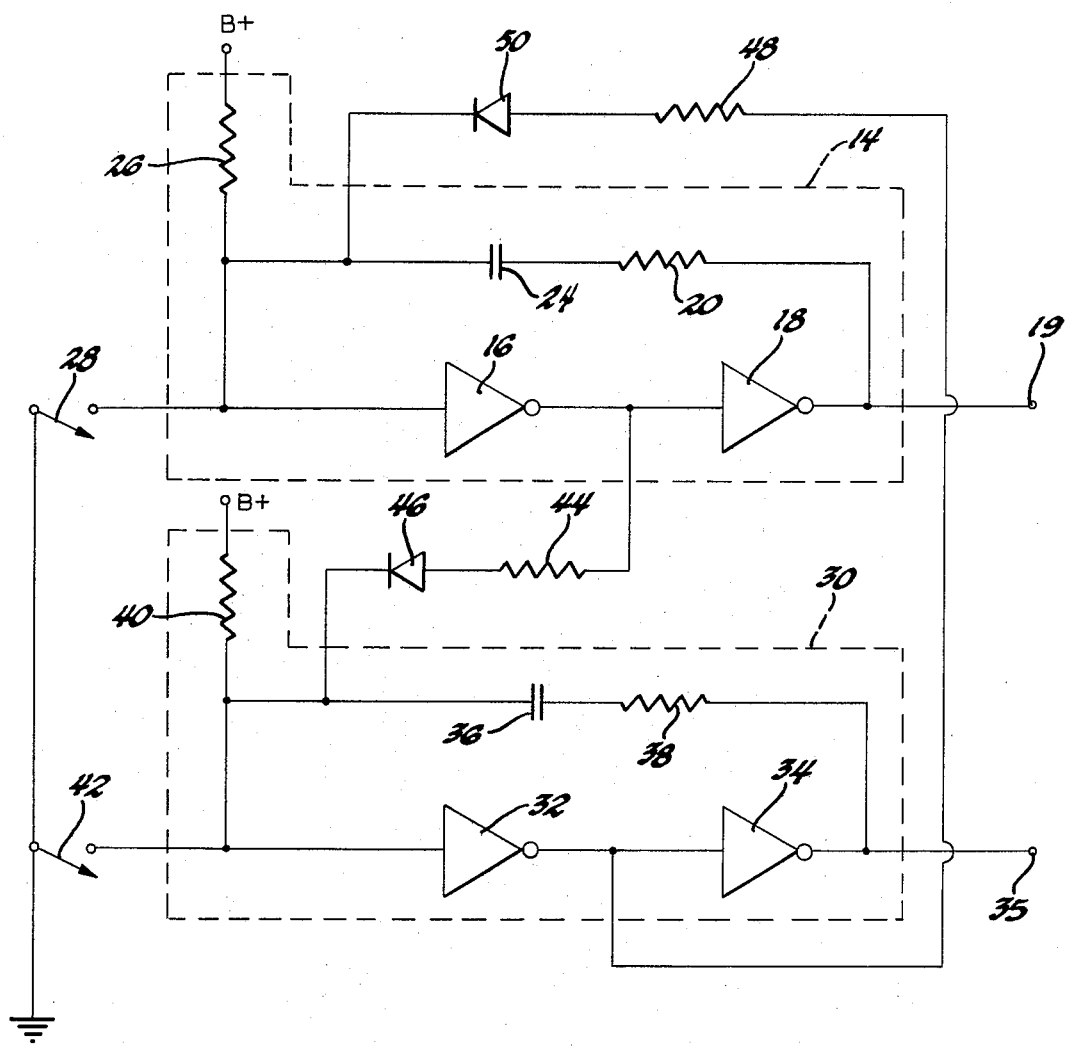

MONOSTABLE MULTIVIBRATOR TIMER CIRCUITS WITH RESET

This invention is directed toward a system for selectively providing at least two timed output signals where an existing timed output signal is terminated upon the initiation of another timed output signal. This type of timer having the reset or override function is particularly applicable to an optical display system wherein the magnitude of one of a number of parameters may be selectively displayed on a single optical display by the operation of a push button associated with the desired parameter to be displayed. After operation of the push button associated with the selected parameter, the display of the magnitude of the selected parameter is provided for a timed period after which the display is terminated. If it is desired to display the magnitude of two or more parameters in sequence without waiting for the termination of the display of the first or subsequent parameter selected, the actuation of a push button associated with another selected parameter is effective to terminate an existing timed display so as to immediately provide for display of the most recent selected parameter.

The invention may be best understood by reference to the following description of a preferred embodiment of the invention and the drawing which is a circuit diagram illustrating the preferred embodiment of the invention.

Referring to the drawing, there is described a system for providing a timed output at either of two terminals on a selected basis. The system includes a first multivibrator 14 which includes an inverter 16 whose output is coupled to the input of an inverter 18. The output of the inverter is coupled to an output terminal 19. A feedback circuit comprised of a resistor 20 and a timing capacitor 22 is coupled between the output of the inverter 18 and the input of the inverter 16 which comprises the input of the monostable multivibrator 14. The input of the multivibrator 14 is coupled to a voltage source B+ through a resistor 26. A manually operable normally open switch 38 is coupled between the input of the monostable multivibrator 14 and ground. The value of the resistor 20 is small relative to the value of the resistor 26 so that the time constant of the monostable multivibrator 14 is determined primarily by the capacitor 24 and the resistor 26.

When the input to the inverter 16 is above its threshold level, which for C-MOS devices is one half of the supply voltage, the output thereof is at ground potential and the output of the inverter 18 is at the supply voltage level. Therefore, the initial condition of the monostable multivibrator 14 when the normally open switch 28 is in the open position is as follows: The input to the inverter 16 is at the voltage level B+, the output of the inverter 18 and consequently the terminal 19 is at the voltage level B+, and the voltage across the capacitor 24 is zero.

Upon actuation of the normally open switch 28, a ground signal is applied to the input of the inverter 16 whose output then shifts to the voltage level B+. The output of the inverter 18 is thereby shifted to ground potential, which signal level constitutes the timed output signal of the monostable multivibrator 14 at the output terminal 19. The output of the inverter 18 is shifted to ground potential virtually simultaneously with the ground signal input to the inverter 16 so that the voltage across the capacitor 24 remains at zero.

Upon release and resultant opening of the normally open switch 28, the ground signal is removed from the input of the inverter 16 and the capacitor 24 begins to charge from the voltage source B+ through the resistor 26 and to the output of the inverter 18 which is at ground potential. When the voltage charge exceeds the threshold level of the inverter 16, its output shifts to ground potential to cause the output of the inverter 18 to shift to the positive voltage B+ and terminate the ground signal output of the monostable multivibrator 14 at the output terminal 19. In summary, the monostable multivibrator 14 provides an output signal (ground potential) at the terminal 19 upon the actuation of the normally open switch 28 and terminates the output signal after release of the normally open switch 28 after a time period determined by the time constants of the resistor 26 and the capacitor 24. Thereafter, the monostable multivibrator 14 reverts to its normal state until the normally open switch 28 is again actuated to initiate the timed output signal.

A second multivibrator 30 is provided which is identical to the monostable multivibrator 14. The multivibrator 30 includes the series coupled inverters 32 and 34, with the output of the inverter 34 being coupled to an output terminal 35. A timing capacitor 36 and a resistor 38 are series coupled between the output of the inverter 34 and the input of the monostable multivibrator 30 at the input of the inverter 32. The timing resistor 40 is coupled between the voltage source B+ and the input to the inverter 32. A normally open switch 42 is coupled between the input of the monostable multivibrator 30 and ground so as to provide a ground signal input to the inverter 32 upon its actuation.

The operation of the monostable multivibrator 30 in response to selected operation of the normally open switch 42 is identical to the operation of the monostable multivibrator 14 previously described. In this respect, the actuation of the normally open switch 42 shifts the output of the inverter 34 and consequently the output terminal 35 from the voltage level B+ to ground potential which comprises the timed output signal of the monostable multivibrator 30. The ground signal is provided for a timed duration upon release of the normally open switch 42 as determined by the time constants of the resistor 40 and the capacitor 36.

The output terminals 19 and 35 may be coupled to a circuit for controlling a visual display such that the actuation of the switch 28 will effect display by gating or other means, the value of one parameter for the time duration while the actuation of the switch 42 may effect display of the value of another parameter for the timed duration.

Upon actuation of one of the switches 28 and 42 to provide for a timed output at one of the output terminals 19 and 35, it is desirable to permit the timed output to be generated at the other one of the output terminals prior to the termination of the first initiated timed output. In this respect, it may be desired to initiate a visual display of a second parameter prior to the termination of a visual display of a first selected parameter. To accomplish this, the inverting output of each of the monostable multivibrators 14 and 30 at the output of the respective inverters 16 and 32 provides a signal which is used to terminate a timed output existing at the other one of the monostable multivbrators.

The output of the inverter 16 is coupled to the input of the monostable multivibrator 30 through a resistor 44 and a diode 46. The output of the inverter 32 is coupled to the input of the monostable multivibrator 14 through a resistor 48 and a diode 50.

Assuming that the normally open switch 28 is selectively operated, a timed output signal is initiated at the output terminal 19 by the monostable multivibrator 14 as previously described. In a display system, this output signal may effect the display of the value of a parameter associated with the normally open switch 28. If after observation of the value of the parameter associated with the switch 28 and prior to the termination of the timed output signal at the terminal 19 it is desired to provide a display of a parameter associated with the normally open switch 42, the normally open switch 42 is operated to cause the output of the inverter 32 to shift to the voltage level B+ which is coupled to the input of the monostable multivibrator 14 through the resistor 48 and the diode 50 to quickly charge the capacitor 24 to the threshold level of the inverter 16 to thereby shift the output of the inverter 18 to a positive voltage level and terminate the timed output signal at the output terminal 19. Simultaneously, the output of the inverter 34 shifts to ground potential in the manner previously described to initiate the timed output signal at the output terminal 35 to provide for the selected display associated with the normally open switch 42. In the same manner, an existing timed output signal at the output terminal 35 is terminated upon actuation of the normally open switch 28 by the output of the inverter 16.

The inverters 16, 18, 32 and 34 may take the form of C-MOS devices wherein their threshold levels are one-half of the supply voltage B+. Further, additional numbers of monostable multivibrators similar to the multivibrators 14 and 30 may be provided, each having a normally open switch associated therewith which is effective when operated to provide a timed output. The inverting output of each of the monostable multivibrators are coupled to the input of each of the remaining monostable multivibrators to cause the termination of an existing timed output signal upon the initiation of another timed output signal. If a timed positive output signal is desired, the output of the inverters providing the inverted output (inverters 16 and 32 in the drawing) may be used.

The description of the preferred embodiment for the purpose of illustrating the invention is not to be construed as limiting or restricting the invention as many modifications may be made by the exercise of skill in the art without departing from the scope of the invention.

I claim:

1. A system for selectively providing a timed output signal at one of at least two output terminals characterized in that selectively providing a timed output signal at one of the output terminals is effective to terminate an existing timed output signal at the remaining output terminals, the system comprising:

a voltage source, the low voltage side of the voltage source defining a point of reference potential:

at least first and second monostable multivibrators, each of said multivibrators including amplifying means having an input terminal, a noninverting output terminal and an inverting output terminal, a timing capacitor coupled between the input terminal and the noninverting output terminal, a timing resistor coupled between the high voltage side of the voltage source and the input terminal, the noninverting output terminal being normally set by the voltage source to a high voltage and the inverting output terminal being normally set by the voltage source to the reference potential, and a selectively operable switch means effective when operated to apply a reference potential pulse to the input terminal so as to shift the noninverting output terminal from the high voltage to reference potential and shift the inverting output terminal from the reference potential to the high voltage, said noninverting and inverting output terminals remaining at the reference potential and high voltage, respectively, during the period of the reference potential pulse and thereafter for a specified time duration determined by the time constant of the timing capacitor and the timing resistor to provide the timed output signal at the inverting and noninverting output terminals; and circuit means coupled between the inverting output terminal of the amplifying means in each of the monostable multivibrators to the input terminals of the remaining ones of the monostable multivibrators so that selective operation of a switch means associated with one of the monostable multivibrators is effective to quickly charge the timing capacitor of another one of the monostable multivibrators providing a timed output signal so as to terminate the last mentioned timed output signal.

2. A system for selectively providing a timed output signal at one of at least two output terminals characterized in that selectively providing a timed output signal at one of the output terminals is effective to terminate an existing timed output signal at the remaining output terminals, the system comprising:

a voltage source, the low voltage side of the voltage source defining a point of reference potential;

at least first and second monostable multivibrators, each of said multivibrators including first and second inverters, means coupling the output of the first inverter to the output of the second inverter, a timing capacitor coupled between the input of the first inverter and the output of the second inverter, a timing resistor coupled between the high voltage side of the voltage source and the input of the first inverter, the output of the second inverter being normally set by the voltage source to a high voltage and the output of the first inverter being normally set by the voltage source to the reference potential, and a selectively operable switch means effective when operated to apply a reference potential pulse to the input of the first inverter so as to shift the output of the second inverter from the high voltage to reference potential and shift the output of the first inverter from the reference potential to the high voltage for the period of the reference potential pulse and thereafter for a specified time duration determined by the time constant of the timing capacitor and the timing resistor to provide the timed output signal at the output of the first and second inverters; and circuit means coupled between the output of the first inverter in each of the monostable multivibrators to the inputs of the first inverters in the remaining ones of the monostable multivibrators so that selective operation of a switch means associated with one of the monostable multivibrators is effective to quickly charge the timing capacitor of another one of the monostable multivibrators providing a timed output signal so as to terminate the last mentioned timed output signal.

* * * * *